June 12, 1962 | H. T. MINDEN | 3,038,241
SEMICONDUCTOR DEVICE
Filed Dec. 22, 1958
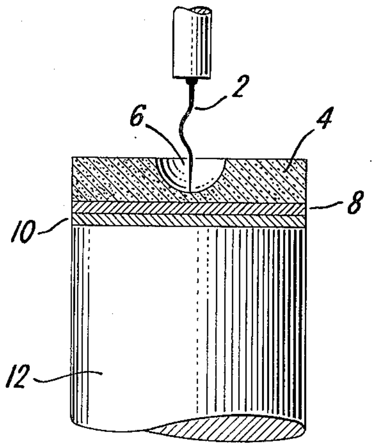
INVENTOR
HENRY T. MINDEN
BY [signature]
ATTORNEY 3,038,241

SEMICONDUCTOR DEVICE

Henry T. Minden, Roslyn Heights, N.Y., assignor, by mesne assignments, to Sylvania Electric Products Inc., Wilmington, Del., a corporation of Delaware Filed Dec. 22, 1958, Ser. No. 782,025
2 Claims. (Cl. 29—25.3)

My invention relates to semiconductor rectifiers.

In one type of semiconductor rectifiers a metallic point is placed in contact with a surface of a base layer composed of a semiconductor intermetallic compound. It is often necessary, particularly, when such a rectifier is to be employed at microwave frequencies, to minimize the electrical spreading resistance of the rectifier. To this end, the base layer must be as thin as possible.

I have developed a new process for reducing the thickness of this base layer and have thus reduced the electrical spreading resistance of a rectifier of the type described above.

In accordance with the principles of my invention, I provide a substrate composed of a semiconductor intermetallic compound (i.e. a semiconductor containing at least two different elementary constituents alloyed together in such manner that the atoms of these constituents are in fixed integral ratios).

A small amount or dot of one of these constituents is placed on the surface of the substrate. The substrate is then heated to a temperature at which the substrate, in the region about the dot, will dissolve to a predetermined depth. The substrate is then cooled, whereupon an amount of said one constituent substantially equal to that of the dot is reconstituted in a region extending within said substrate from said depth to a level above the original surface of the substrate. The reconstituted region contains small recrystallized particles of the compound itself. This region (and the entrapped particles) is then removed as, for example, by etching, leaving a crater in the substrate. A base contact is secured to the surface of the wafer opposite the crater, and a point contact is placed in contact with the crater. The thickness of the substrate under the point then constitutes the effective thickness of the base layer. The electrical spreading resistance of the rectifier thus produced is minimized when the effective thickness is adjusted to be commensurate with the diameter of the point.

An illustrative embodiment of my invention will now be described with reference to the accompanying figure.

The surface of a thin substrate of gallium arsenide is first cleaned by etching in a sodium hydroxide-hydrogen peroxide solution. A gallium dot is then placed on the top surface of the substrate. The dotted substrate is then placed in a tube furnace and fired in an inert atmosphere to a temperature between 800°–1000° C. for a period of 2–3 hours until the dot melts, and the gallium arsenide in contact with the dot dissolves to a reproducible depth dependent upon the volume to area ratio of the dot and the temperature of alloying.

The substrate is then removed from the furnace and cooled to room temperature for example at a rate of about 200° C. per hour. The substrate is found to have a reconstituted region of gallium which extends from said predetermined depth to a level above the original surface of the substrate. This reconstituted gallium is substantially equal in amount to the gallium contained in the dot. Further the reconstituted region contains small discrete particles of recrystallized gallium arsenide. The reconstituted gallium is then removed as, for example, by being dissolved in hot concentrated hydrochloric acid; the dissolved material together with the loosened particles forms a slurry which is poured off, leaving a crater in the substrate. (This acid attacks gallium without attacking gallium arsenide.)

The substrate is masked on the crater side with a plastic spray; the opposite side of the substrate is then copper plated. The copper plated surface is then soldered to a support electrode and a point contact formed, for example, of Phosphor bronze is applied to the crater.

The resulting structure is shown in the figure wherein the substrate 4 has a crater 6 in which is inserted a point contact 2. The bottom surface of substrate 4 is bonded to a layer of copper 8. This layer 8, in turn, is bonded by a layer 10 of solder to a supporting electrode 12.

The thickness of the substrate under the point constitutes the effective thickness of the base layer. By suitable control of the alloying process, this effective thickness can be of the same order as the diameter of the point contact; this is the condition of minimum electrical spreading resistance.

This process can be readily used for other semiconductor intermetallic components capable of being alloyed by one of their constituents as explained in more detail in the copending application Serial No. 724,199, filed March 26, 1958, by Henry T. Minden et al., now abandoned.

What is claimed is:

1. A method for producing a rectifier from a substrate of a semiconductor intermetallic compound comprising the steps of placing a dot of one of the constituents of said compound on a surface of said substrate; heating said substrate to a temperature at which the substrate, in a region about said dot dissolves to a predetermined depth; cooling said substrate to form a reconstituted region of said one constituent extending within said substrate from said depth to a level above the original surface of said substrate, said reconstituted region containing small discrete recrystallized particles of said compound, chemically removing said reconstituted region and said particles from said substrate to form a crater therein; connecting a first electrode to the wall of said crater, and connecting a second electrode to the surface of said substrate opposite said crater.

2. A method for producing a rectifier from a gallium arsenide substrate comprising the steps of placing a gallium dot on a surface of said substrate; heating said substrate to a temperature falling within the range 800°–1000° C. at which the substrate, in a region about said dot dissolves to a predetermined depth; cooling said substrate to form a reconstituted region of gallium extending within said substate from said depth to a level above the original surface of said substrate, said reconstituted region containing small discrete recrystallized particles of gallium arsenide, chemically dissolving said reconstituted region whereby said region and said particles are removed from said substrate and said crater is formed, connecting a first electrode to the wall of said crater, and connecting a second electrode to the surface of said substrate opposite said crater.

References Cited in the file of this patent

UNITED STATES PATENTS

| | | |
|---|---|---|
| 2,713,132 | Mathews et al. | July 12, 1955 |
| 2,765,516 | Haegele | Oct. 9, 1956 |
| 2,773,925 | Rothlein et al. | Dec. 11, 1956 |
| 2,813,326 | Liebowitz | Nov. 19, 1957 |
| 2,818,536 | Carman et al. | Dec. 31, 1957 |
| 2,836,878 | Shepard | June 3, 1958 |
| 2,865,794 | Kroger et al. | Dec. 23, 1958 |